(12) United States Patent
Denzinger et al.

(10) Patent No.: US 6,936,404 B2
(45) Date of Patent: Aug. 30, 2005

(54) RADIATION-SENSITIVE RECORDING MATERIAL HAVING A STRUCTURED BACK

(75) Inventors: Steffen Denzinger, Mainz (DE); Michael Dörr, Mainz (DE); Günther Hultzsch, Wiesbaden (DE); Engelbert Pliefke, Wiesbaden (DE)

(73) Assignee: Agfa-Gevaert (BE)

(*) Notice: Subject to any disclaimer, the term of this patent is extended or adjusted under 35 U.S.C. 154(b) by 253 days.

(21) Appl. No.: 10/016,089

(22) Filed: Dec. 13, 2001

(65) Prior Publication Data

US 2002/0127489 A1 Sep. 12, 2002

(30) Foreign Application Priority Data

Dec. 20, 2000 (DE) .......................... 100 63 591

(51) Int. Cl.$^7$ .................... G03F 7/021; G03F 7/023
(52) U.S. Cl. .................. 430/271.1; 430/162; 430/166; 430/264; 430/276.1; 430/302; 430/523; 430/531
(58) Field of Search ................ 430/166, 162, 430/264, 271.1, 276.1, 302, 531, 523, 167

(56) References Cited

U.S. PATENT DOCUMENTS

| | | | |
|---|---|---|---|
| 3,235,384 A | 2/1966 | Neugebauer et al. | 96/33 |
| 3,635,709 A | 1/1972 | Kobayashi | 96/33 |
| 4,563,410 A | 1/1986 | De Jaeger et al. | 430/204 |
| 5,998,567 A | 12/1999 | Eichhorn et al. | 528/272 |
| 6,132,948 A | 10/2000 | Hatakeyama | 430/619 |
| 6,140,037 A * | 10/2000 | Katoh et al. | 430/619 |
| 6,294,298 B1 | 9/2001 | Denzinger et al. | 430/49 |
| 6,528,244 B1 * | 3/2003 | Katoh et al. | 430/619 |
| 6,670,092 B2 * | 12/2003 | Denzinger et al. | 430/264 |
| 6,670,097 B2 * | 12/2003 | Denzinger et al. | 430/272.1 |

FOREIGN PATENT DOCUMENTS

| | | |
|---|---|---|
| DE | 12 14 086 | 4/1966 |
| DE | 199 08 529 | 8/2000 |
| EP | 410 500 | 1/1991 |
| EP | 423 399 | 4/1991 |
| EP | 490 515 | 6/1992 |
| EP | 0 528 395 | 2/1993 |
| EP | 528 395 | 2/1993 |
| EP | 717 317 | 6/1996 |
| EP | 0 883 028 | 12/1996 |
| EP | 883 027 | 12/1998 |
| EP | 883 028 | 12/1998 |
| EP | 900 653 | 3/1999 |
| EP | 908 305 | 4/1999 |
| EP | 1 031 881 | 8/2000 |
| GB | 1 512 080 | 5/1978 |
| GB | 2 324 381 | 10/1998 |
| JP | 02/040657 | 2/1990 |
| JP | 06/202312 | 7/1994 |
| JP | 09/265176 | 10/1997 |

OTHER PUBLICATIONS

Chenier, Phillip, J Survey of Industrial Chemistry (3rd edition), Kluwer Academic Publishers/Plenum Press, Copyright 2002, pp 265–287.*

* cited by examiner

*Primary Examiner*—John S. Chu
(74) *Attorney, Agent, or Firm*—Connolly Bove Lodge & Hutz

(57) ABSTRACT

The invention relates to a recording material for the production of offset printing plates, having a web- or plate-form support, a radiation-sensitive layer on the front of the support and a continuous, pigment particle-free layer on the back of the support. The back layer essentially consists of an organic polymeric material having a glass transition temperature Tg of at least 45° C., and its surface has a Bekk smoothness of from 5 to 800 s. It also relates to a process for the production of this recording material.

20 Claims, No Drawings

RADIATION-SENSITIVE RECORDING MATERIAL HAVING A STRUCTURED BACK

FIELD OF THE INVENTION

The invention relates to a recording material for the production of offset printing plates having a web- or plate-form support, a radiation-sensitive layer on the front of the support, and a continuous, pigment particle-free layer on the back of the support. It furthermore relates to a process for the production of the recording material.

BACKGROUND OF THE INVENTION

Recording materials for the production of offset printing plates (also known as "pre-sensitized printing plates") are usually supplied in stacks of 20 units or more. Extended storage times, the action of pressure and/or elevated ambient temperatures frequently result in the plates adhering to one another. On removal of individual plates from the stack, scratches may then form on the front and/or back. The problem of undesired adhesion can be substantially eliminated with the aid of separating paper. The paper is particularly necessary in the case of recording materials having an aluminium support with an uncoated back. However, the separating paper results in new problems. The recording materials are frequently produced in in-line finishing plants, in which the plates are automatically cut to the desired size and packed. The separating paper is likewise inserted automatically. However, this step is relatively slow and susceptible to faults. In addition, the paper in some cases affects the radiation-sensitive layer and adversely changes its properties. This may result in discoloration of the layer, due to a change in the pH, a drop in its light sensitivity or rapid ageing. With surface-sealed papers, the interaction between paper and radiation-sensitive layer can be reduced; however, such papers are significantly more expensive. In relatively large print shops, the plate stacks provided with separating paper are generally processed in automatic plants, with the paper usually being blown out. This operation is again relatively slow and susceptible to faults. In addition, the paper cannot be recycled and has to be disposed of.

The recording material described in JP-A 02/040657 manages without separating paper. A UV-cured layer produced from a photopolymerizable material is located on the back of its aluminium support. In addition to monomers, the composition used for the production of the back coating may also comprise photosensitizers, binders, fillers, inhibitors for preventing thermally induced polymerization of the monomers and other additives.

JP-A 06/202312 discloses a recording material for the production of offset printing plates whose aluminium support is likewise coated on the back with an organic polymer, such as polyethylene, polypropylene, polybutadiene, polyester, polycarbonate, polyvinyl acetal, polyvinyl chloride, polystyrene or a methacrylate resin. The back coating reduces attack by the aqueous-alkaline developer on the aluminium support. The light-sensitive layer in this recording material comprises from 1 to 10% by weight of a compound which is insoluble in the developer.

A recording material having an anodized aluminium support, a photopolymerizable layer on the aluminium oxide layer produced by anodization, and a back coating having a thickness of from 0.1 to 8.0 μm is disclosed in JP-A 09/265176. This back coating consists of a saturated copolymerized polyester resin, a phenoxy resin, a polyvinyl acetal or a vinylidene chloride copolymer, each of which has a glass transition temperature $T_g$ of 20° C. or above. This is intended to prevent scratching of the plates during transport in the stack and delamination of the radiation-sensitive layer due to excessive adhesion to the back of the overlying plate.

A recording material for the production of offset printing plates which can be stacked without separating paper is also described in EP-A 528 395. It comprises a support (made of aluminium), a layer of an organic polymeric material having a glass transition temperature of not less than 20° C. with a thickness of from 0.01 to 8.0 μm on the back of the support, and a light-sensitive layer on the front of the support. A discontinuous matting layer consisting of particles having a mean diameter of not greater than 100 μm and a mean height of not greater than 10 μm is in turn located on the light-sensitive layer. However, matting layers, in particular those comprising a material having a low glass transition temperature, tend to stick to the back of the overlying plate in the stack. This may cause relatively large areas of the radiation-sensitive layer to be delaminated, meaning that the recording material can then no longer be used further.

A recording material having a matting layer on the radiation-sensitive layer and a further, likewise discontinuous matting layer on the back of the support material is disclosed in EP-A 883 028. The support material is generally an aluminium web having a length of up to several thousand meters and a thickness of about 0.2 mm which is generally rolled up again after the coating ("coil-to-coil process"). A higher pressure prevails in the interior of the roll than in the outer regions. This results in the matting layer located on the front being damaged to a non-uniformly great extent. A recording material having a greatly damaged matting layer requires longer evacuation times later in the contact copying frame. This problem is substantially solved by the additional matting layer on the back.

EP-A 490 515 relates to a pre-sensitized printing plate which, after imagewise exposure, is developed using an aqueous alkali metal silicate solution. In order to prevent the developer from dissolving aluminium out of the back of the plate, this is provided with an organic polymeric coating which is insoluble in the developer. The coating comprises polymers such as polyethylene, polypropylene, polybutene, polybutadiene, polyamide, polyurethane, polyurea, polyimide, polysiloxane, polycarbonate, epoxy resins, polyvinyl chloride, polyvinylidene chloride or polystyrene. It may also comprise a thermally or photochemically curing component.

DE-A 199 08 529 describes a recording material having a support which has on the back a layer comprising an organic polymeric material having a glass transition temperature of 45° C. or above, and a pigmented light-sensitive layer located on the front of the support.

DE-A 100 29 157 relates to a recording material for the production of offset printing plates which has a dimensionally stable support, a radiation-sensitive layer located on the front of the support, and a layer which comprises an organic polymeric material and is resistant to processing chemicals located on the back of the support, where the glass transition temperature of the organic polymeric material is 35° C. or above, and the layer located on the back is pigmented.

The known recording materials with a back coating have the disadvantage that their production is complex and is frequently associated with technical problems. On use of solid particles (for example silica gel pigments), two-phase systems inevitably form. The solid constituents here can sediment again very quickly, meaning that it is frequently difficult to apply a two-phase mixture of this type in the form of a layer. In addition, the solid particles are not always compatible with the surrounding matrix material. In addition, silica gel particles may be attacked by very strong developers (i.e. those having a pH of greater than 13) and can be dissolved under certain conditions, for example after extended exposure. This then again results in problems associated with the dissolution of oxide on the back, with corrosion phenomena in the case of silver plates or even detachment of the back layer.

OBJECT OF THE INVENTION

It is an object of the present invention to find a back coating in which these problems no longer occur and which, in addition, can be produced simply and inexpensively.

SUMMARY OF THE INVENTION

The object has been achieved by a continuous rough or structured back coating which manages without solid pigment particles and can therefore be applied in the form of a single-phase, liquid mixture. The mixture is so viscous that once a rough or structured surface has been embossed or produced in another manner, it exhibits little or no flow before the subsequent, generally thermal and/or photochemical curing. To this end, the liquid coating mixture (also referred to as "lacquer" below) generally has a viscosity in the range from 80 to 1000 mPa·s, preferably from 100 to 600 mPa·s.

The present invention thus relates to a recording material for the production of offset printing plates having a web- or plate-form support, a radiation-sensitive layer on the front of the support and a continuous, pigment particle-free layer on the back of the support, which is characterized in that the layer on the back essentially consists of an organic polymeric material having a glass transition temperature Tg of at least 45° C., and its surface has a Bekk smoothness of from 5 to 800 s.

An essential constituent of the back coating is generally an organic, polymeric material which is virtually insoluble in water and aqueous-alkaline developers. In one embodiment, the back coating is physically drying (i.e. not self-curing). Particularly suitable materials for a coating of this type are polyolefins (such as polyethylene, polypropylene, polybutylene, polybutadiene or polyisoprene), polyesters, polycarbonates, polyamides, polysiloxanes, polystyrene, homopolymers or copolymers of or with alkyl acrylate or alkyl methacrylate units (such as polymethyl methacrylate (PMMA) or styrene-methyl methacrylate copolymers), polyvinyl acetal, phenoxy resins (for example resins made from bisphenol A and epichlorohydrin), polyvinyl chloride (PVC) or polyvinylidene chloride (PVDC). If necessary, the layer may in addition comprise additives in secondary amounts. These include, for example, plasticizers, dyes, silicone compounds or surface-active agents. In the case of physically drying, non-self-curing back coatings, the organic polymeric material preferably has a glass transition temperature of 50° C. or above. In a further embodiment, the back coating is self-curing. In this case, besides the organic polymeric materials, it also comprises monomeric or oligomeric compounds which polymerize, condense or crosslink on exposure to radiation, heat and/or oxidizing agents and thus effect curing of the layer. Particularly suitable for this purpose are addition-polymerizable acrylates or methacrylates, such as ethyl (meth)acrylate, propyl (meth)acrylate, butyl (meth)acrylate, 2-hydroxyethyl (meth)acrylate, trimethylolpropane mono-, di- or tri(meth)acrylate or pentaerythritol tri(meth)acrylate. Also suitable are (meth)acrylamides, such as N-methyl-, N-ethyl-, N-propyl-, N-butyl- or N-isobutyl-(meth)acrylamide; furthermore allyl esters, such as allyl acetate; vinyl ethers, such as butyl vinyl ether, octyl vinyl ether, decyl vinyl ether, 2-methoxyethyl vinyl ether, diethylene glycol vinyl ether or benzyl vinyl ether; polyfunctional urethane acrylates which cure on exposure to UV radiation, and diisocyanate/diol mixtures which cure on exposure to heat to give polyurethanes. In accordance with general practice, "(meth)acrylate" in the present application stands for "acrylate and/or methacrylate". A corresponding meaning applies to "(meth)acrylamide" and other derivatives of acrylic or methacrylic acid. As described, the curing of the back coating may also be induced by actinic radiation, i.e. the back coating is in this case light-sensitive. For distinction therefrom, the radiation-sensitive layer on the front of the support is referred to as "image layer", since only this is exposed imagewise and developed.

The rough or structured surface of the back coating is achieved with the aid of special application methods or tools. Particularly suitable is firstly roller application. Use can be made here of smooth or engraved rollers which effect direct or indirect (offset) application, co-rotating or counter-rotating application. Also suitable is application with the aid of a counterpressure roller or kiss coat.

The lacquer is initially located in a lacquer trough, from where it is applied to the support (which is preferably an aluminium web or an aluminium band having a thickness of from about 0.1 to 0.3 mm) by means of an uptake roller and an application roller. If necessary, one or more counter-rollers may also be employed here. Instead of an open lacquer trough, it is also possible to use a closed chamber doctor blade.

The structure here depends on the surface of the coating roller, the relative speeds of the rollers to one another and of the coating roller relative to the substrates. Depending on the magnitude of the speed difference between the application roller and the band, the lacquer structure created on the application roller is transferred to the band with little if any change of particular importance for this is of course the rheology of the lacquer, in particular its viscosity. The flow properties of the lacquer can be adjusted as required by warming the lacquer and/or the rollers and/or the band. in the case of transfer of a lacquer structure produced at elevated temperature onto an unheated band, the rapid lacquer cooling on the substrate ensures an increase in viscosity and thus fixing of the structures produced. Also of importance are the hardness of the rubber rollers employed and their contact pressure. The desired structures can be produced both with surface-structured rollers and with smooth rollers. Structured rollers are known in various forms. Of these, particular mention should be made of engraved rollers. These can have recesses (pyramidal indents, hexagonal indents, etc.), line grids (hatched rollers), diagonal line grids or combinations thereof.

The desired non-planar structure may also be produced after the coating, or one that is already present can be subsequently changed. Thus, a structured surface can be smoothed using a distributor roller (for example a counter-rotating chrome roller). A longitudinally oriented line structure can be achieved using a structured roller or an attached coating bar (wire coating bar or grooved coating bar).

One lacquer structuring possibility that can be used is the viscosity dependence of the application temperature. By "quenching" of a lacquer warmed to above room temperature during application on an unheated band, the application structure can be retained until curing. By preheating the support material, the lacquer flow can be improved and the surface structure levelled.

The dimensionally stable, two-dimensional support can be produced from a multiplicity of materials. Suitable are, for example, supports made from plastic film (in particular polyester films, especially polyethylene terephthalate films), but preferably supports made from a metal or a metal alloy. Of these, preference is in turn given to supports made from aluminium or an aluminium alloy. The front of the aluminium support is advantageously mechanically and/or electrochemically roughened and/or anodically oxidized and, if necessary, additionally hydrophilized (for example by treatment with polyvinylphosphonic acid). In the case of anodic oxidation, the back of the aluminium support may also be coated in part or in full with an aluminium oxide layer. The continuous layer of aluminium oxide is electrically non-conducting and thus prevents the formation of local elements. This is important, for example, if the image layer contains silver halide. However, further layers between support and radiation-sensitive layer are likewise possible, for example hydrophilizing layers or priming layers. The support may also be provided with a layer of a ceramic material (additive graining). The thickness of the support is generally from 0.1 to 1.0 mm, preferably from 0.2 to 0.6 mm.

It is possible for the support provided with the back coating to be rolled up again ("coil-to-coil" process) Since the back layers are particularly stable, they are virtually undamaged in the process, even in the interior of the roll, where the highest pressure prevails and the greatest forces act thereon.

Depending on the nature of their composition, the image layer may be sensitive to UV radiation, visible light and/or IR or heat radiation. The radiation-sensitive component in the image layer may, for example, be a diazonium salt, a combination of a photopolymerization initiator and a polymerizable monomer (in particular a monomer containing a polymerizable ethylenically unsaturated group), a combination of a compound which forms acid on irradiation, and a compound which can be cleaved by the photochemically generated acid. The image layer may additionally comprise IR dyes, carbon black and/or sensitizers.

Use is particularly frequently made in positive-working image layers of esters of a 1,2-naphthoquinone-2-diazido-4- or -5-sulphonic acid and a compound containing at least one phenolic hydroxyl group. The last-mentioned compound preferably has at least 3 phenolic hydroxyl groups. Very particular preference is given for the esterification to compounds containing from 3 to 6 phenolic hydroxyl groups. Examples thereof are 2,3,4-trihydroxybenzophenone, 2,3,4-trihydroxy-3'-methyl-, -propyl- or -isopropylbenzophenone, 2,3,4,4'-tetra-hydroxybenzophenone, 2,3,4,2',4'-pentahydroxybenzophenone, 2,3,4,2',3',4'-hexahydroxybenzophenone and 5,5'-diacyl-2,3,4,2',3',4'-hexahydroxydiphenylmethane. In general, not all the phenolic hydroxyl groups therein are esterified. The degree of esterification, based on all hydroxyl groups, is typically from 60 to 95%. Amides of 1,2-naphthoquinone-2-diazido-4- or -5-sulphonic acid are likewise suitable. Esterification components which can be used are also products of the condensation of pyrogallol and aldehydes or ketones and products of the condensation of alkylated phenol and formaldehyde. The content of radiation-sensitive compounds is from about 1 to 50% by weight, based on the total weight of the non-volatile constituents of the mixture. Image layers comprising naphthoquinonediazidosulphonic acid esters or -sulphonamides as radiation-sensitive component are particularly sensitive to UV and visible light.

Positive-working image layers which are insensitive to UV radiation and visible light, but can be imaged by IR or heat radiation are likewise known (EP-A 900 653). The layer comprises, as radiation-sensitive components, carbon black particles or a dye in disperse form which is sensitive in the IR region. IR radiation, in particular IR laser radiation, effects imagewise differentiation in the layer, enabling the irradiated areas to be removed by a developer.

It is also possible to use recording materials having a positive-working image layer which comprises a combination of a compound containing at least one C—O—C bond which can be broken by acid and a compound which forms a strong acid on exposure to actinic radiation. Layers of this type are known to the person skilled in the art and are described in large number, for example EP-A 717 317.

Besides a polymeric binder, photopolymerizable image layers usually comprise a free-radical-polymerizable component (monomer) and an initiator which is capable of initiating polymerization of the monomer on exposure to actinic radiation. The initiator is, for example, a combination of a photoreducible dye and a metallocene, in particularly a titanocene. The monomers frequently contain free-radical-polymerizable acrylate or methacrylate groups. The light sensitivity of such layers can be increased still further by employing monomers containing at least one photooxidizable group or additionally onium compounds, in particular iodonium or sulphonium salts. Photopolymerizable layers are impaired by atmospheric oxygen. They are therefore often protected by a cover layer which is relatively impermeable to oxygen, but which can be removed completely again by aqueous developers.

The image layer may also comprise silver halide as radiation-sensitive component. It then includes a silver halide emulsion layer. Preference is given to image layers which work by the silver complex diffusion transfer reversal process (abbreviated to DTR process). It then consists of two or more part layers, as described in greater detail in EP-A 410 500, 423 399 or 883 027. The lowermost, i.e. closest to the support, is usually a receiving layer comprising silver nuclei. The nuclei initiate the development of the silver complexes that have diffused in, giving a silver image when a suitable developer acts thereon. The development nuclei are preferably produced by application of colloidal silver, gold, platinum, palladium or other metals. They may furthermore consist of heavy-metal sulphides or selenides, for example sulphides of antimony, bismuth, cadmium, cobalt, lead, nickel, palladium, platinum, silver or zinc. Palladium sulphide and the nickel/silver sulphide $NiS.Ag_2S$ described in U.S. Pat. No. 4,563,410 are particularly suitable. Also suitable are polyselenides or polysulphides of heavy metals. In addition, dyes or pigments may be present as antihalo agents, either as a constituent of the nucleus layer or in a separate layer. The type of dye or pigment depends on the region of the spectrum in which the silver halide emulsion layer is sensitive. The nucleus layer is very thin (generally less than 0.5 $\mu$m); it normally contains no binder. As already described, the nucleus layer is not absolutely necessary. If no such layer is present, constituents of the metallic support take on the role of the development nuclei. Finally, it is also possible to arrange the image receiving layer or nucleus layer on a separate support. DTR materials of this type consisting of two elements are known in principle.

A thin, silver-free interlayer, for example a layer of pigment and a hydrophilic, film-forming polymer, for example polyvinyl alcohol or pullulane, is located above the receiving layer. The next is a silver halide emulsion layer. The silver halide is, for example, silver chloride, bromide, bromoiodide, chlorobromoiodide or a mixture thereof. The silver halide advantageously comprises more than 90% by weight, based on the total weight of the silver halides, of silver chloride. In addition, small amounts of silver chloroiodide and/or silver bromide are frequently also present. The silver halide particles in the emulsion layer normally have a mean size of from 0.05 to 1.0 $\mu$m, preferably from 0.25 to 0.45 $\mu$m. They can also be produced by the core of the particles having a different composition than the shell. Silver bromide is frequently located exclusively in the core. The binders used for this layer are generally hydrophilic colloids, preferably gelatine. The gelatine is advantageously not hardened. Instead of or in addition to the gelatine, it is also possible to employ other polymers, for example polyvinyl alcohol, polyvinylpyrrolidone, polyvinylimidazole, poly(meth)acrylamide, polyacrylic acid, cellulose or cellulose derivatives (particularly cellulose ethers, such as hydroxyalkyl- or carboxymethylcellulose), starch or alginates. Finally, the emulsion layer may also comprise dyes in order to adjust the spectral sensitivity of the silver halide layer and/or in order to prevent undesired light scattering. These are, for example, methine, cyanine or hemicyanine dyes. Finally, the silver halide layer may comprise conventional emulsion stabilizers, for example azaindenes, especially tetra- or pentaazaindenes. The azaindenes are preferably substituted by amino or hydroxyl groups. An example of a substituted azaindene of this type is 4-hydroxy-6-methyl-1,3,3a,7-tetraazaindene. Other suitable stabilizers are quaternized benzothiazoles, benzotriazoles and heterocyclic mercapto compounds, for example mercapto-substituted tetrazoles and pyrimidines. An example of a tetrazole of this type is 1-[3-(2-sulphobenzoylamino)phenyl]-5-mercaptotetraazole.

In a preferred embodiment, a protective layer may also be located on the silver halide emulsion layer. It generally has a weight of from 0.50 to 1.75 g/m$^2$, preferably from 0.60 to 1.20 g/m$^2$ and advantageously consists of unhardened gelatine (a 10% strength by weight aqueous solution of the gelatine has a viscosity of preferably less than 20 mPa·s at 40° C. and at pH 6). The cover layer may in turn comprise dyes and/or coloured pigments and/or matting agents. The matting agent here generally consists of particles having a mean diameter of from 0.2 to 10 μm, preferably from 0.5 to 6.0 μm.

Negative-working layers which are provided for imaging with UV or visible light in many cases comprise diazonium salt polycondensation products. These are, in particular, products of the condensation of aromatic diazonium salts. Condensation products of this type are known, inter alia, from DE-A 12 14 086 (=U.S. Pat. No. 3,235,384). They are generally prepared by condensation of a polycyclic aromatic diazonium compound, preferably of substituted or unsubstituted diphenylamine-4-diazonium salts with active carbonyl compounds, preferably formaldehyde, in a strongly acidic medium, preferably concentrated phosphoric acid.

The image layer may also be imaged by an electrophotographic principle. In this case, it usually comprises a photoconductive layer comprising an organic photoconductor on an electrically conductive support.

In addition to the radiation-sensitive component, the image layer usually also comprises a polymeric, organic binder. Preference is given to phenol-formaldehyde condensates, where the term "phenol" here is also taken to mean substituted phenols, such as resorcinol, cresol, xylenol, and the like. Besides or in addition to the formaldehyde, it is also possible to employ other aldehydes or also ketones as condensation partner. Also suitable are products of the reaction of diisocyanates with diols or diamines, in particular those containing acid groups. Mention should also be made of polymers containing units of vinylaromatic compounds, N-aryl-(meth)acrylamides or aryl (meth)acrylates, where these units in each case also contain one or more carboxyl group(s), phenolic hydroxyl groups, sulphamoyl or carbamoyl groups.

If the recording material according to the invention is pigmented or matted on the front, the Bekk smoothness of the surface on this side is generally less than 600 s, preferably from 100 to 150 s.

The further processing (imagewise exposure or irradiation, development, etc.) for the recording materials according to the invention is carried out virtually in the same way as for recording materials without back coatings. Since the back coating is resistant to processing chemicals, it also prevents attack by the developer on the support. This is particularly important in the case of aluminium supports. These are attacked by alkaline developers, in particular by strongly alkaline developers, which increases the developer load and thus reduces its service life.

The following examples serve to illustrate the invention. pbw therein stands for part(s) by weight. Percentages are per cent by weight, unless otherwise stated.

In the examples, the following methods are employed for producing the back coating:

Roller Application Methods

R1—Roller Application for Smooth Surfaces
Method: direct application with counter-rotation
System: lacquer trough/chrome engraved roller (100 mm in diameter) with a 54 line/cm grid and 30° inclination, plastic scraper blade on the engraved roller
After application to the band, the lacquer coat was smoothed by a distributor roller. The distributor roller is a polished chrome roller with a diameter of 80 mm around which the free-running band is looped loosely and which rotates at 200 rpm against the band run.
Substrate: aluminium band, thickness 190 μm
Application parameters: band speed: 40 m/min peripheral speed of the chrome engraved roller: 60 m/min peripheral speed of the distributor roller: 50 m/min UV curing: 200 mW/cm, no inert gas
The surface was homogeneous and very smooth. Bekk smoothness: 1700 s.

R2—Roller Application for Finely Structured Surfaces
Method: indirect co-rotation
System: lacquer trough/chrome roller (100 mm in diameter), rubber application roller (EPDM, hardness Shore 72, diameter 100 mm); lacquer trough and chrome roller temperature-controlled
Substrate: roll-brightened aluminium band, thickness 140 μm
Application parameters: lacquer temperature: 55° C. band speed: 40 m/min peripheral speed of the chrome uptake roller: 22 m/min chrome roller/rubber roller gap: 0.4 mm peripheral speed of the rubber application roller: 32 m/min rubber roller/substrate pressure: 4.5 bar
UV curing: 400 mW/cm, no inert gas
The surface had a very finely grained structure in the longitudinal direction. Bekk smoothness: 187 s R3—Roller Application for Groove Structure
Method: indirect co-rotation
System: lacquer trough/chrome roller (100 mm in diameter), rubber application roller (EPDM, hardness Shore 65, diameter 80 mm); lacquer trough and chrome roller temperature-controlled
Substrate: roll-brightened aluminium band, thickness 190 μm
Application parameters: lacquer temperature: 45° C. band speed: 40 m/min peripheral speed of the chrome uptake roller: 22 m/min chrome roller/rubber roller gap: 0.6 mm peripheral speed of the rubber application roller: 32 m/min rubber roller/substrate pressure: 4.5 bar
UV curing: 200 mW/cm, no inert gas
The surface exhibited fine, longitudinally oriented grooves. Bekk smoothness: 227 s R4—Engraved Roller for Line Application Method: direct co-rotation
System: chrome engraved roller with chamber doctor blade (250 mm in diameter). A hatched roller (line grid with 54 lines/cm, 28° inclination and a capacity of 32 ml/m$^2$) was used. Lacquer stock tank, chamber doctor blade and chrome engraved roller temperature-controlled
Substrate: back of a pretreated aluminium band, thickness 140 µm
Application
parameters: lacquer temperature: 51° C. band speed: 60 m/min peripheral speed of the engraved roller: 58 m/min chrome roller/substrate gap: 0.35 mm
UV curing: 600 mW/cm with nitrogen inertization to an oxygen content of 63 ppm After curing, the surface exhibited uniform diagonal lines in the geometry of the hatched roller. Bekk smoothness: 55 s W4—Engraved Roller Application
Method: indirect co-rotation, transfer by the kiss coat method
System: ceramic engraved roller with chamber doctor blade (200 mm in diameter). A grid of hexagonal indents with a capacity of 32 ml/m$^2$ was used. Rubber transfer roller (polyurethane, hardness Shore 68, diameter 200 mm). Lacquer stock tank, chamber doctor blade and ceramic engraved roller temperature-controlled
Substrate: back of one of the above-mentioned coatings on aluminium band, thickness 150 µm
Application
parameters: lacquer temperature: 48° C. band speed: 80 m/min peripheral speed of the ceramic engraved roller: 80 m/min, in the same direction as the rubber roller ceramic roller/rubber roller gap: 0.35 mm peripheral speed of the rubber application roller: 79 m/min The transfer to the band was carried out by the kiss coat method in order to reduce the risk of possible entry traces of the aluminium band edges onto the rubber roller.
UV curing: 600 mW/cm, without inert gas The surface had a coarse-grained structure. Bekk smoothness: 80 s W5—Roller Application with Structured Rubber Roller
Method: indirect counter-rotation
System: lacquer trough/chrome roller (100 mm in diameter), structured rubber application roller (polyurethane, hardness Shore 78, diameter 95 mm). A nonwoven was incorporated into the rubber roller, giving the roller a paper-like surface structure after rubber coating. Lacquer trough and chrome roller were temperature-controlled.
Application
parameters: lacquer temperature: 45° C. band speed: 20 m/min peripheral speed of the chrome uptake roller: m/min
Gap: chrome roller/rubber transfer roller: 0.75 mm peripheral speed of the rubber transfer roller: 22 m/min
Pressure: rubber roller/substrate: 4.5 bar
UV curing: 200 mW/cm, without inert gas The surface had a paper-like structure. Bekk smoothness: 125 s.

Application with the Aid of Slot Die Systems

In contrast to conventional die gaps, which have a plane-parallel outlet in order to produce the most uniform lacquer distribution possible transversely to the web run, a gap was used whose outlet was not uniform over its width, but instead exhibited the shape of a large number of regular exit channels. This was achieved by laying a mask which was longitudinally structured in the direction of the lacquer flow into the die gap, and the cross section of the longitudinal lines determines the volume of the lacquer exit transversely to the web. The lacquer application volume was selected in such a way that the lacquer no longer flowed completely transversely to the web, leaving the surface longitudinally structured.

The channels of the die gap may be rectangular, triangular, U-shaped or have a different design. The channel separations can be regular or irregular. In order to modify the lacquer viscosity, the die can be temperature-controlled.

S1—Slot Die System

The slot die had a die channel exit which had uniform triangular structures with a 90° angle and a base length of 250 µm and a channel height of 250 µm.
Band speed: 12 m/min
Die/band separation: 30 µm
Application volume: 2 cm$^3$/min at a coating width of 1 cm
Substrate: roll-brightened aluminium band with a thickness of 290 µm A regular line pattern with 4 lines per cm resulted. The elevation of the lines (height difference between valley and peak) was up to 6 µm.

Spray Application

During spray coating, orange-peel structures are undesired effects formed by the lacquer atomizing into small droplets at the spray system, and these droplets having to flow again to form a continuous wet film after hitting the substrate. Depending on the droplet diameter, the surface tension of the lacquer and the substrate, the lacquer viscosity, the surface charge of the droplets and the total amount of lacquer applied, some of the droplet structure is retained or flows to form a completely homogeneous wet film.

It is also known to apply discrete droplets, for example as spacers on planographic printing plates, by spray methods.
Atomization methods: high rotation bell with electrostatic support compressed-air atomization airless atomization purely electrostatic atomization methods (for example disc, ESTA spray bar)

SP-1 Spray Application: High Rotation Bell with Electrostatic Support

One of the lacquers described below was atomized by means of a horizontally arranged spray bell rotating at high speed ("high rotation bell") and deposited on an aluminium band earthed in contact moving beneath it. The lacquer was heated to 58° C. by passage through a temperature-controllable static mixing system immediately in front of the spray element.
Spray conditions: high rotation bell with a diameter of 60 mm, speed 28,000 rpm charging 28 kV distance from the band: 210 mm spray cone width about 500 mm, spray rate: 30 ml/min band speed: 12 m/min A coating with an orange-peel structure is obtained. Bekk smoothness: 250 s SP-2 Spray Application: Compressed-air Atomization One of the lacquers described below was atomized by means of a two-component spray nozzle with compressed air and deposited onto an aluminium band moving vertically from top to bottom. The lacquer was heated to 65° C. by passing through an electric lacquer heater before the spray nozzle.
Spray conditions: two-component nozzle with a diameter of 0.45 mm and air pressure of 4.5 bar distance from the band: 150 mm, spray width about 150 mm spray rate: 22 ml/min band speed 10 m/min A coating with a strong orange-peel structure resulted.

Back Coatings

L1: 80 pbw of a multifunctional acrylate monomer (®Laromer LR8986 from BASF AG)
  20 pbw of a multifunctional acrylate monomer (®Laromer DPGDA from BASF AG)
  3 pbw of a 20% strength solution of cellulose acetobutyrate in tripropylene glycol diacrylate (TPGDA) (CAB 551-0.2 from BASF AG)
  2 pbw of multifunctional acrylate monomer (®Ebecryl 170 from UCB S.A.)
  4 pbw of 2-hydroxy-2-methyl-1-phenylpropan-1-one as photoinitiator (®Darocur 1173 from Ciba Specialty Chemicals)

were applied in such a way as to give a wet film having a weight of 3 g/m². The wet film was subsequently exposed for 20 s under a 160 W/cm mercury vapour lamp. The viscosity of the lacquer at RT was 378 mPa·s.

L2: A thermally curing lacquer comprising 15 pbw of a polyurethane (®Desmodur 2170 from Bayer AG) and 85 pbw of butanone was applied and dried at a dryer temperature of 150° C., giving a layer having a weight of 21 g/m². The lacquer viscosity at room temperature (RT; corresponds to 23° C.) was 589 mPa·s.

L3: Polyether sulfone (®Ultrason 6010 from BASF AG) 12% in N-methylpyrrolidone (NMP) was applied and dried at a dryer temperature of 150° C., giving a layer having a weight of 9 g/m². The viscosity of the solution at RT was 931 mPa·s

|  | Application method | Lacquer | Bekk | $R_{at}$ | $R_{al}$ | $R_{zt}$ | $R_{zl}$ |
|---|---|---|---|---|---|---|---|
| RS1 | R1 | L1 | 1700 | 0.10 | 0.10 | 0.41 | 0.33 |
| RS2 | R2 | L1[(o)] | 187 | 0.80 | 0.75 | 3.79 | 2.50 |
| RS3 | R3 | L1 | 227 | 0.07 | 0.93 | 0.33 | 3.35 |
| RS4 | R4 | L1 | 42 | 1.61 | 0.27 | 8.55 | 1.17 |
| RS5 | W5 | L1 | 125 | 0.70 | 1.26 | 2.92 | 5.16 |
| RS6 | W6 | L2 | 147 | 1.02 | 1.29 | 4.51 | 5.04 |
| RS7 | R4 | L3 | 7.5 | 2.60 | 0.36 | 9.39 | 1.43 |
| RS8 | S1 | L3 | 439 | 0.07 | 0.74 | 0.26 | 2.81 |
| RS9 | SP1 | L1 | 250 | 0.66 | 0.65 | 1.88 | 1.71 |
| RS10 | SP2 | L1 | 397 | 0.56 | 0.49 | 1.12 | 0.98 |

[(o)]comprises 2 pbw of silica gel filler having a mean particle size of 4 μm (based on the total weight)

Front Coatings

P1: 7.8 pbw of a cresol-formaldehyde novolak having a hydroxyl number of 420 in accordance with DIN 53783/53240 and a mean molecular weight by GPC of 6000 (polystyrene standard),
  3.2 pbw of a product of the esterification of 1.5 mol of 1,2-naphthoquinone-2-diazido-5-sulphonyl chloride and 1 mol of 2,3,4-trihydroxybenzophenone,
  0.4 pbw of 1,2-naphthoquinone-2-diazido-5-sulphonyl chloride,
  0.2 pbw of Victoria Pure Blue (Colour Index 44045),
  to 100 pbw of a solvent mixture of THF and 1-methoxypropan-2-ol (50:50)
Layer weight: 2 g/m²

P2: 7.8 pbw of a cresol-formaldehyde novolak having a hydroxyl number of 420 in accordance with DIN 53783/53240 and a mean molecular weight by GPC of 6000 (polystyrene standard),
  3.2 pbw of a product of the esterification of 1.5 mol of 1,2-naphthoquinone-2-diazido-5-sulphonyl chloride and 1 mol of 2,3,4-trihydroxybenzophenone,
  0.4 pbw of 1,2-naphthoquinone-2-diazido-5-sulphonyl chloride,
  0.2 pbw of Victoria Pure Blue (Colour Index 44045),
  0.1 pbw of a silica gel filler having a mean particle size of 4 μm,
  to 100 pbw of a solvent mixture of THF and 1-methoxypropan-2-ol (50:50)
Layer weight 2 g/m²

P3: 4.5 pbw of a product of the esterification of 1,2-diazonaphthoquinone-5-sulphonyl chloride and a pyrogallol-acetone resin (see Example 1 of U.S. Pat. No. 3,635,709),
  11.0 pbw of a cresol-formaldehyde novolak resin,
  0.2 pbw of 2-(4-methoxyphenyl)-4,6-bis(trichloromethyl)-s-triazine,
  0.1 pbw of Oil Blue # 603 (Orient Chemical Industries Co. Ltd.),
  0.04 pbw of fluorosurfactant (®Megafac F-177 from Dainippon Ink and Chemicals),
  100.00 pbw of butan-2-one,
  100.00 pbw of propylene glycol monomethyl ether.
Layer weight 2.0 g/m²

This layer was dried for 1 minute at 100° C. A matting layer was subsequently applied as follows:

An MMA-ethyl acrylate-acrylic acid copolymer (weight ratio 65:20:15) which had been partially neutralized (sodium, potassium or ammonium salt) was dissolved in water to give a 12% strength solution. This solution was applied using a rotating electrostatic spray device (speed of the spray head 25,000 rpm). 40 ml/min were sprayed with the voltage at the spray head being −90 kV. The spray process was carried out at 25° C. and 50% atmospheric humidity. 2.5 seconds after spraying with the copolymer solution, the copy layer was sprayed with steam and then dried for 5 seconds using hot air (60° C., 10% relative atmospheric humidity). Elevations were formed on the matting layer with an average height of 6 μm and an extension of 30 μm. The mean thickness of the matting layer was 0.15 g/m².

P4: 7.8 pbw of a cresol-formaldehyde novolak having a hydroxyl number of 420 in accordance with DIN 53783/53240 and a mean molecular weight by GPC of 6000 (polystyrene standard),
  3.2 pbw of a product of the esterification of 1.5 mol of 1,2-naphthoquinone-2-diazido-5-sulphonyl chloride and 1 mol of 2,3,4-trihydroxybenzophenone,
  0.4 pbw of 1,2-naphthoquinone-2-diazido-5-sulphonyl chloride,
  0.2 pbw Victoria Pure Blue (C.I. 44045),
  to 100 pbw of a solvent mixture of tetrahydrofuran (THF) and 1-methoxypropan-2-ol (50:50)

This layer was dried for 1 minute at 100° C. The layer weight was then determined as 1.9 g/m². A matting layer was applied as follows:

An electrostatic spray device with a capillary was charged with a solution comprising 35% of a cresol-formaldehyde resin and 65% of ethylene glycol ethyl ether acetate (=2-ethoxyethanol acetate). The conductivity of the solution was 1.2×10⁷ pS m⁻¹. A voltage of −30 kV was applied. The coating was then carried out at a temperature of 30° C. from a distance of 300 mm from the coated plate at a spray rate of 0.70 cm³. In this way, a discontinuous layer was obtained whose particles had a diameter of from about 30 to 40 μm and did not penetrate through the copy layer.

P5: 4.70 pbw of a cresol-formaldehyde novolak having a hydroxyl number of 420 in accordance with DIN 53783/

53240 and a mean molecular weight by GPC of 6000 (polystyrene standard), 1.90 pbw of a polyacetal made from 2-ethylbutyraldehyde and triethylene glycol, 0.23 pbw of 2-(4-styrylphenyl)-4,6-bistrichloromethyl-s-triazine, 0.02 pbw of Crystal Violet, 0.10 pbw of a silica gel filler having a mean particle size of 4 μm, to 100.00 pbw of a solvent mixture of butan-2-one and ethylene glycol monomethyl ether (90:10).

Layer weight 1.9 g/m²

N1 62.00 pbw of a maleic anhydride-functionalized polyvinylbutyral having a molecular weight $M_w$=about 80,000 which contains 71% of vinylbutyral, 2% of vinyl acetate and 27% of vinyl alcohol units, 21.00 pbw of a diazonium salt polycondensation product prepared from 1 mol of 3-methoxy-diphenylamine-4-diazonium sulphate and a 4,4'-bismethoxymethyldiphenyl ether in 85% strength phosphoric acid, isolated as mesitylene sulphonate, 2.50 pbw of phosphoric acid, 3.00 pbw of Victoria Pure Blue FGA (C.I. Basic Blue 81), 0.70 pbw of phenylazodiphenylamine, 2.570 pbw of ethylene glycol monomethyl ether and 780 pbw of butan-2-one.

N2 as N1, but in addition 0.10 pbw of a silica gel filler having a mean particle size of 3 μm, N3 as N1, but with an additional matting layer applied as follows:

An MMA-ethyl acrylate-acrylic acid copolymer (weight ratio 65:20:15) which had been partially neutralized (sodium, potassium or ammonium salt) is dissolved in water (12% strength by weight). This solution was applied using a rotating electrostatic spray device (speed of the spray head 25,000 rpm). 40 ml/min were sprayed, with the voltage at the spray head being −90 kV. The spray process was carried out at 25° C. and 50% atmospheric humidity. 2.5 seconds after spraying with the copolymer solution, the copy layer was sprayed with steam and then dried for 5 seconds using hot air (60° C., 10% relative atmospheric humidity). Elevations were formed on the matting layer with an average height of 6 μm and an extension of 30 μm. The mean thickness of the matting layer is 0.15 g/m².

The layer weight of the dried layers N1 to N3 was in each case 0.9 g/m² (in the case of layer N3 before application of the matting layer).

N4 4.50 pbw of a copolymer of maleic anhydride and methyl methacrylate having an acid number of from 100 to 120 and a mean molecular weight $M_w$=100,000, 2.00 pbw of a urethane acrylate (®Plex 6661 from Röhm AG), 3.00 pbw of a product of the reaction of 1 mol of hexamethylenediamine with 2 mol of hydroxyethyl methacrylate, 0.35 pbw of phenylacridine, 0.10 pbw of Leuko Crystal Violet, 0.05 pbw of Crystal Violet, to 100.00 pbw of a mixture of propylene glycol monomethyl ether (®Dowanol) and butan-2-one (70:30).

After drying, the layer weight was 1.0 g/m². A water-soluble cover layer was applied to this radiation-sensitive layer. To this end, the following coating solution was used:

7.00 pbw of a polyvinyl alcohol containing 12% of acetate groups, 0.01 pbw of a fatty alcohol ethoxylate having 8 ethylene oxide units, to 100.00 pbw of water.

The weight of the cover layer after drying was 2.0 g/m².

T1 9.70 pbw of a cresol-formaldehyde novolak having a hydroxyl number of 420 in accordance with DIN 53783/53240 and a mean molecular weight by GPC of 6000 (polystyrene standard), 0.80 pbw of poly(4-hydroxystyrene) having an $M_w$ of from 4000 to 6000 and an $M_n$ of from 2100 to 3100 (®Maruka Lyncur M, grade S2 from Maruzen Petrochemical Co., Ltd.), 8.00 pbw of a carbon black dispersion comprising
5.00 pbw of carbon black (special black from Degussa AG),
66.00 pbw of the above-described novolak (30% strength in γ-butyrolactone),
28.99 pbw of γ-butyrolactone and
0.01 pbw of silicone antifoam (RC31 from Agfa-Gevaert AG), 40.00 pbw of propylene glycol monomethyl ether,
31.00 pbw of acetone and
10.50 pbw of γ-butyrolactone.

T2: 9.00 pbw of polystyrene latex having a mean particle size of 2 μm (25% strength in water), prepared by emulsion polymerization 27.10 pbw of an anionic cyanine dye, 2-[2-(2-chloro-3-{2-[1,1-dimethyl-3-(2-sulfoethyl)-1,3-dihydrobenzo[e]indol-2-ylidene]ethylidene}cyclohex-1-enyl)vinyl]-(1,1-dimethyl-1H-benzo[e]indolium-3-yl] ethanesulfonate (triethylammonium salt), see formula (I) in EP-A 908 305

27.00 pbw of a polyacrylic acid having a mean molecular weight of 500,000 (determined by GPC in DMAC using PMMA standards)

0.50 pbw of fluorosurfactant (®MegaFac F-177 from Dainippon Ink & Chemicals)

to 100 pbw of demineralized water was applied in such a way as to give a layer of 2 g/m².

A1 Firstly, a nucleus layer comprising 2.3 mg of silver nuclei (prepared from colloidal silver) was produced. An interlayer comprising a mixture of binder (pullulane) and coloured pigment (®Levanyl Red dispersion) was applied to this nucleus layer. The interlayer comprised 0.1 g/m² of pullulan and 0.2 g/m² of Levanyl Red dispersion.

An unhardened, negative-working, cadmium-free gelatin/silver chloroiodide emulsion (weight ratio 99.75:0.25) was then applied to the interlayer. This layer furthermore comprised 1 mmol of 4-hydroxy-6-methyl-1,3,3a,7-tetraazaindene and 2.2 mmol of 1-[3-(2-sulfobenzoylamino)phenyl]-5-mercaptotetrazole per mole of AgX. The silver halide was applied in an amount which corresponded to 2.4 g/m² of silver nitrate. The gelatin was applied in an amount of 1.6 g/m². The gelatin comprised two different types, one of which had a viscosity of 21 mPa·s (0.7 g/m²) and the other had a viscosity of 14 mPa·s (0.9 g/m²).

Finally, a cover layer comprising 0.7 g/m² of gelatin having a viscosity of between 10 and 12 mPa·s, 0.1 g/m² of Levanyl Red dispersion and 0.12 g/m² of a matting agent having a particle diameter of 7.5 μm was applied to the silver halide emulsion layer.

E1 6.50 pbw of styrene-MA copolymer (styrene/MA=1.4) having a mean molecular weight $M_w$ of 100,000, 4.00 pbw of 2,5-bis(4-diethylaminophenyl)-1,3,4-oxadiazole, 0.02 pbw of Rhodamine FB (C.I. 45170) and 0.02 pbw of acriflavin in 45.00 pbw of acetone and 45.00 pbw of γ-butyrolactone.

None of the examples exhibited any technical differences in copying from plates without a back coating. For comparison, no example was recorded without back coating since the disadvantages of this variant have been adequately explained in the prior art.

Test 1

Appearance after storage under the influence of relatively high weights (conditions: stack with 100 600×800 mm plates with additional weighting of 50 kg for 2 weeks at 50° C. and 50% relative atmospheric humidity)

| | |
|---|---|
| -- = | large-area layer delamination due to sticking |
| - = | partial layer delamination |
| 0 = | pinholes due to incipient sticking or change in the visual appearance due to diffusion processes in more than 10% of the plates |
| + = | substantial layer retention |
| ++ = | virtually no layer delamination - flaw rate less than 3%. |

Test 2

Lifting of the stack with grippers of a commercially available automatic processing plant after storage. The percentage of 500 plates in which flaws occurred on lifting off was assessed:

| | |
|---|---|
| -- = | flaws in more than 10% of the plates |
| - = | flaws in up to 10% |
| 0 = | flaws in up to 5% |
| + = | flaws in up to 2% |
| ++ = | no flaws |

The test results are shown in the following table.

What is claimed is:

1. A recording material for the production of offset printing plates, which comprises a web- or plate-form support, a radiation-sensitive layer on the front of the support and a continuous, pigment particle-free layer on the back, and the back layer consists essentially of an organic polymeric material having a glass transition temperature Tg of at least 45° C., and said material has a surface and said surface has a Bekk smoothness of from 5 to 800 s.

2. The recording material according to claim 1, wherein the organic polymeric material is a polymer which has been thermally crosslinked by the action of heat and/or UV radiation.

3. The recording material according to claim 1, wherein the back layer has a Bekk smoothness of from 5 to 600 s.

4. The recording material according to claim 1, wherein the back layer has on its surface a structure consisting of longitudinal or transverse grooves, where the ratio of the Ra values to one another is at least 5, and the ratio of the Rz ratios to one another is at least 6.

5. The recording material according to claim 1, wherein the structure of the back layer is direction-dependent.

6. The recording material according to claim 1, wherein the radiation-sensitive layer located on the front of the support is positive-working.

7. The recording material according to claim 1, wherein the radiation-sensitive layer located on the front of the support is negative-working.

8. The recording material according to claim 1, wherein the radiation-sensitive layer located on the front of the support works on the basis of silver halide.

9. The recording material according to claim 1, wherein the radiation sensitive layer located on the front of the support is thermally positive-working or thermally negative-working.

10. A process for the production of the recording material according to claim 1, which comprises applying the back layer by roller application.

Examples with different front and back coatings:

| Front | Test | RS1 | RS2 | RS3 | RS4 | RS5 | RS6 | RS7 | RS8 | RS9 | RS10 |
|---|---|---|---|---|---|---|---|---|---|---|---|
| P1 | 1 | 0 | | | ++ | | | ++ | | + | |
| | 2 | - | | | ++ | | | ++ | | + | |
| P2 | 1 | + | ++ | ++ | ++ | ++ | ++ | ++ | ++ | ++ | |
| | 2 | + | ++ | ++ | ++ | ++ | ++ | ++ | ++ | ++ | |
| P3 | 1 | | + | + | | | + | | | + | |
| | 2 | | + | + | | | + | | | + | |
| P4 | 1 | - | | + | | + | | + | | + | |
| | 2 | 0 | | ++ | | ++ | | ++ | | ++ | |
| P5 | 1 | | | | ++ | | | | + | | |
| | 2 | | | | ++ | | | | ++ | | |
| N1 | 1 | | + | + | | | + | | | + | |
| | 2 | | + | + | | | + | | | + | |
| N2 | 1 | + | ++ | ++ | ++ | ++ | ++ | ++ | ++ | ++ | |
| | 2 | + | ++ | ++ | ++ | ++ | ++ | ++ | ++ | ++ | |
| N3 | 1 | | | | | | | | + | | + |
| | 2 | | | | | | | | ++ | | ++ |
| N4 | 1 | - | + | + | ++ | + | + | + | + | + | |
| | 2 | - | + | + | ++ | + | + | ++ | + | + | |
| T1 | 1 | | + | + | | + | + | | + | | |
| | 2 | | + | + | | + | + | | + | | |
| T2 | 1 | | + | | ++ | + | | ++ | | + | |
| | 2 | | + | | ++ | + | | ++ | | + | |
| A1 | 1 | 0 | + | + | ++ | + | + | ++ | + | | + |
| | 2 | 0 | + | + | ++ | + | + | ++ | + | | + |
| E1 | 1 | | | + | | | | | | + | |
| | 2 | | | + | | | | | | + | |

11. The process according to claim 10, wherein the roller application is direct roller application.

12. The process according to claim 10, wherein the roller application is indirect roller application.

13. The process according to claim 10, wherein the roller application is carried out using an engraved roller.

14. The process according to claim 10, wherein the roller application is carried out using a structured rubber roller.

15. A process for the production of the recording material according to claim 1, which comprises applying the back layer with the aid of a slot die system.

16. A process for the production of the recording material according to claim 1, which comprises applying the back layer by spray application.

17. The process according to claim 10, wherein the back layer is produced from a lacquer which has a viscosity at room temperature (23° C.) of from 80 to 1000 mPa·s.

18. The process as claimed in claim 10, wherein back layer is produced from a lacquer which has a viscosity at room temperature (23° C.) of from 100 to 600 mPa·s.

19. The recording material according to claim 2, wherein the back layer has a Bekk smoothness of from 5 to 600 s.

20. The recording material according to claim 19, wherein the back layer has on its surface a structure consisting of longitudinal or transverse grooves, where the ratio of the Ra values to one another is at least 5, and the ratio of the Rz ratios to one another is at least 6 and with the proviso that there is no matting layer in the recording material.

* * * * *